United States Patent
Kihara et al.

(10) Patent No.: US 6,522,052 B2
(45) Date of Patent: Feb. 18, 2003

(54) MULTILAYER-TYPE PIEZOELECTRIC ACTUATOR

(75) Inventors: Noriaki Kihara, Nishio (JP); Toshihiko Ito, Nishio (JP); Haruo Isioka, Nishio (JP); Atsushi Murai, Kuwana (JP)

(73) Assignees: Denso Corporation, Aichi-Pref. (JP); Nippon Soken, Inc., Aichi (JP)

(*) Notice: Subject to any disclaimer, the term of this patent is extended or adjusted under 35 U.S.C. 154(b) by 0 days.

(21) Appl. No.: 10/026,800

(22) Filed: Dec. 27, 2001

(65) Prior Publication Data

US 2002/0043901 A1 Apr. 18, 2002

(30) Foreign Application Priority Data

Dec. 28, 2000 (JP) ........................................ 2000-400202
Nov. 6, 2001 (JP) ........................................ 2001-340941

(51) Int. Cl.⁷ ............................................... H01L 41/04
(52) U.S. Cl. .......................... 310/366; 301/363; 301/364
(58) Field of Search ............................. 310/363, 364, 310/365, 366

(56) References Cited

U.S. PATENT DOCUMENTS

| | | | | |
|---|---|---|---|---|
| 6,104,129 A | * | 8/2000 | Okamoto | 310/366 |
| 6,208,026 B1 | * | 3/2001 | Bindig et al. | 257/718 |
| 2001/0026114 A1 | * | 10/2001 | Takao et al. | 310/364 |

FOREIGN PATENT DOCUMENTS

| | | | | |
|---|---|---|---|---|
| DE | 19928187 C1 | * 12/2000 | ......... | H01L/41/047 |
| DE | 100017331 C1 | * 6/2001 | ......... | H01L/41/047 |
| JP | 59-204288 | 11/1984 | | |
| JP | 5-17897 | 5/1993 | | |
| JP | 07283453 A | * 10/1995 | ......... | H01L/41/083 |
| JP | 10-229227 | 8/1998 | | |
| JP | 2001210884 A | * 8/2001 | ......... | H01L/41/083 |
| WO | WO 200079607 A1 | * 10/2000 | ......... | H01L/41/047 |
| WO | WO 200079608 A1 | * 12/2000 | ......... | H01L/41/047 |

* cited by examiner

*Primary Examiner*—Nestor Ramirez
*Assistant Examiner*—Peter Medley
(74) *Attorney, Agent, or Firm*—Nixon & Vanderhye P.C.

(57) ABSTRACT

A multilayer-type piezoelectric actuator having a multilayer piezoelectric unit which is capable of enduring the extension of contraction thereof to prevent the disconnection of external electrodes. The multilayer piezoelectric unit (2) includes a plurality of piezoelectric plates (21) of a piezoelectric material and a plurality of internal electrodes (22) of a conductive material arranged in alternate layers. The external electrodes (3) are arranged on the side surfaces (23), respectively, of the multilayer piezoelectric unit (2) and electrically connected to a plurality of the internal electrodes (22). The external electrodes (3) are each configured of an electrode base (31) arranged in contact with a corresponding side surface (23) of the multilayer piezoelectric unit (2), a tabular metal net conductor (32) arranged on the electrode base (31), and a plurality of conductive adhesives (33) for partially bonding the electrode base (31) and the tabular metal net conductor (32). Adjacent ones of the conductive adhesives (33) have a portion mutually superposed in the direction parallel to the piezoelectric plates (21).

9 Claims, 9 Drawing Sheets

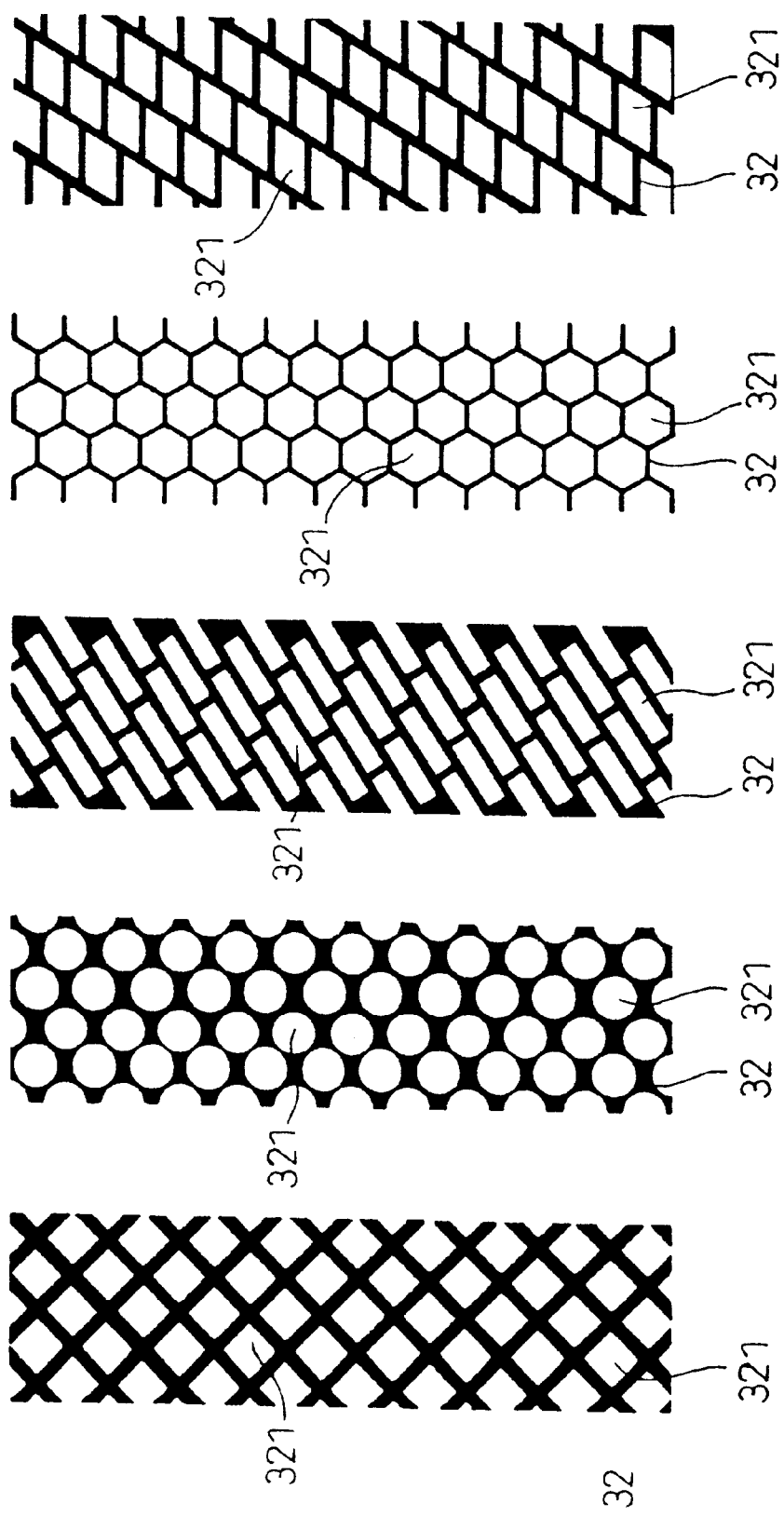

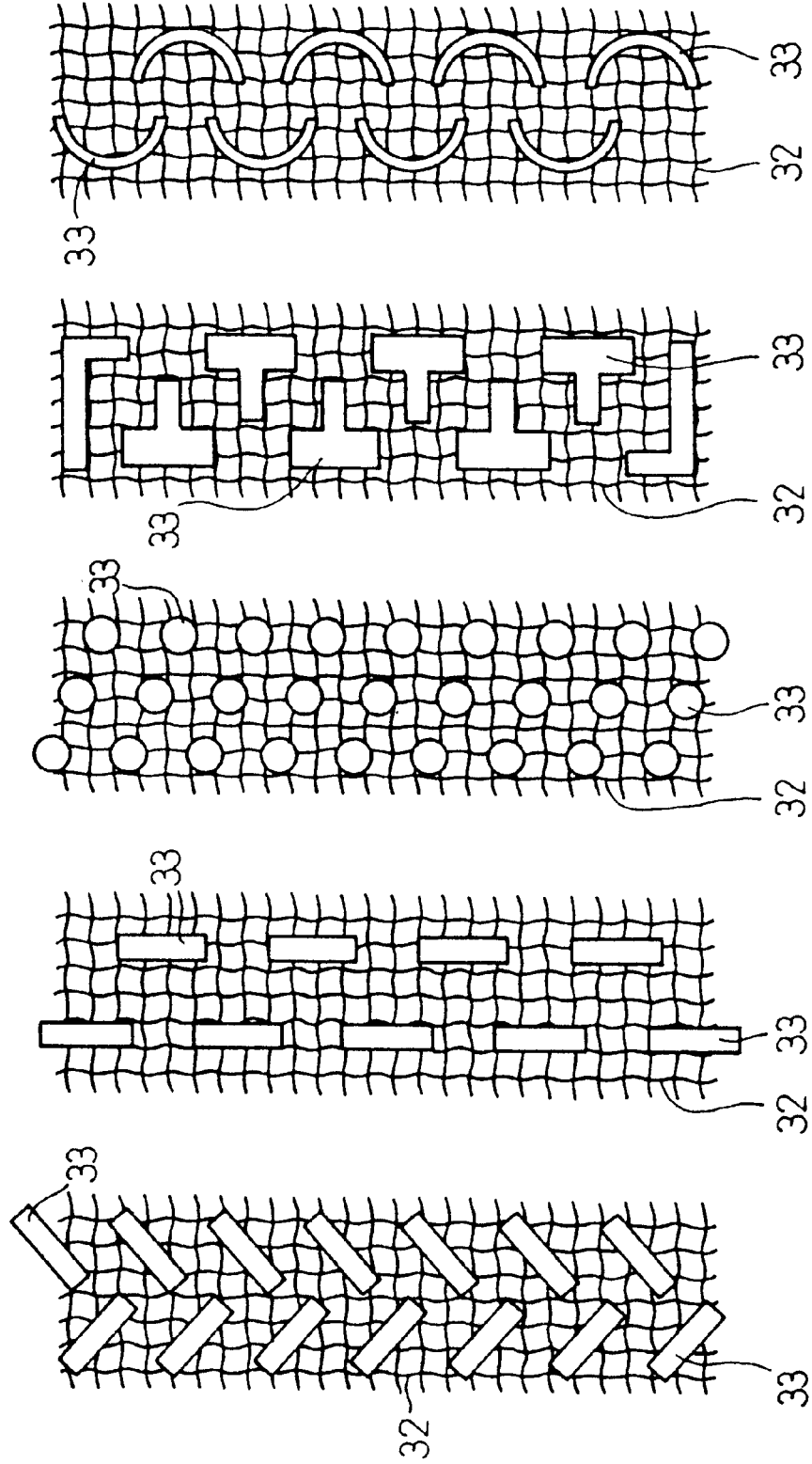

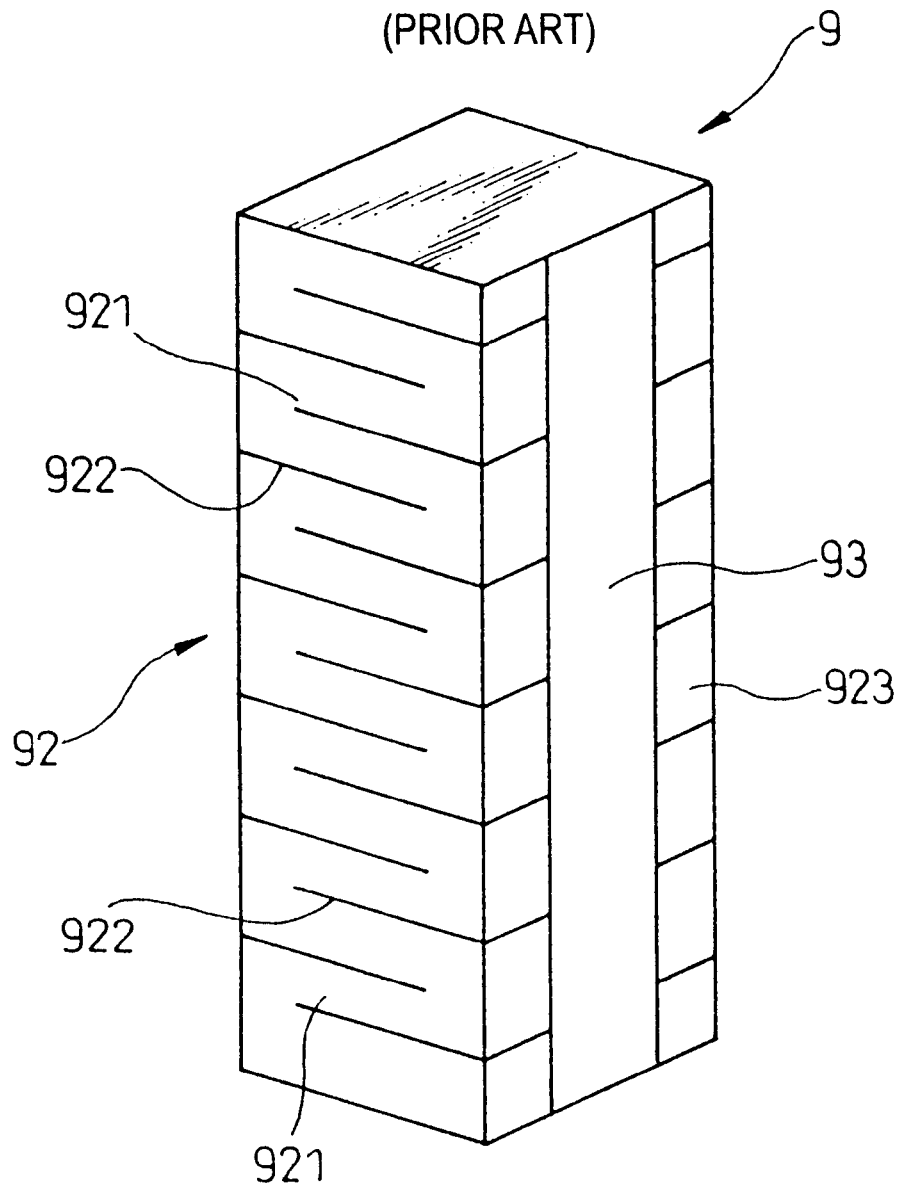

MULTILAYER-TYPE PIEZOELECTRIC ACTUATOR

BACKGROUND OF THE INVENTION

1. Field of the Invention

The present invention relates to a multilayer-type piezoelectric actuator comprising a multilayer piezoelectric unit including a plurality of alternately stacked piezoelectric plates and internal electrodes and a pair of external electrodes arranged on the sides, respectively, of the multilayer piezoelectric unit.

2. Description of the Related Art

A conventional multilayer-type piezoelectric actuator, as shown in FIG. 10, comprises a multilayer piezoelectric unit 92 including a plurality of alternately stacked piezoelectric plates 921 and internal electrodes 922 and a pair of external electrodes 93 arranged on the sides 923, respectively, of the multilayer piezoelectric unit 92 (Japanese Unexamined Patent Publication No. 10-229227).

The multilayer-type piezoelectric actuator 9 is so configured that a voltage is supplied intermittently to the piezoelectric plates 921 from the external electrodes 93 and through the internal electrodes 922 and, by thus extending or contracting the piezoelectric plates 921 in the direction along the thickness, the whole multilayer piezoelectric unit 92 can be displaced by extension or contraction.

The external electrodes 93 of the multilayer-type piezoelectric actuator 9 are formed by printing, drying and baking a conductive material on the side surfaces 923 of the multilayer piezoelectric unit 92. The external electrodes 93, however, are only as thick as about 50 $\mu$m and have a low mechanical strength. For this reason, a reinforcing conductive material such as solder is further applied on the printed conductive material to increase the thickness and thus to secure a practically satisfactory strength of the external electrodes 93.

The external electrodes 93, which are in solid form, cannot endure the extension or contraction of the multilayer piezoelectric unit 92, under voltage, and are liable to develop a crack and break. If the external electrodes 93 are disconnected by breakage, a voltage may not to be applied to all the multilayer piezoelectric unit 92.

The "disconnection of the external electrodes" is defined as the state in which the electrical conduction between the external electrodes and any of the Internal electrodes is cut off and a voltage cannot be supplied to the piezoelectric plates through the internal electrodes.

An attempt to apply a reinforcing conductive material such as solder to thicken the external electrodes 93 to prevent the cracking and breakage thereof, on the other hand, undesirably limits the mechanical extension or contraction of the multilayer piezoelectric unit 92. This poses the problem of a reduced amount of the originally intended extension or contraction of the multilayer-type piezoelectric actuator

SUMMARY OF THE INVENTION

The present invention has been achieved in view of the problems of the prior art described above, and the object thereof is to provide a multilayer-type piezoelectric actuator in which the multilayer piezoelectric unit is sufficiently extended or contracted without disconnecting the external electrodes.

According to a first aspect of the invention, there is provided a multilayer-type piezoelectric actuator comprising a multilayer piezoelectric unit including a plurality of piezoelectric plates of a piezoelectric material and a plurality of internal electrodes of a conductive material stacked alternately with each other and a pair of external electrodes arranged on the side. surfaces, respectively, of the multilayer piezoelectric unit and electrically connected to the internal electrodes, wherein the external electrodes are each configured of an electrode base arranged in contact with the corresponding side surface of the multilayer piezoelectric unit, a tabular metal net conductor arranged on the electrode base and a plurality of conductive adhesives for partially bonding the electrode base and the tabular metal net conductor and wherein adjacent ones of the conductive adhesives have a mutually superposed portion along the direction parallel to the piezoelectric plates.

What is most noticeable about this invention is that the external electrodes are each formed of the electrode base, the tabular metal net conductor and a plurality of conductive adhesives.

The tabular metal net conductor is a braid of conductive wires of such a material as gold, silver, copper, nickel or stainless steel and is sufficiently flexible along the direction of extension or contraction, i.e. the direction of stacking of the multilayer piezoelectric unit. The tabular metal net conductor need not be braided with conductive wires, as long as it is continuous along the direction of stacking of the multilayer piezoelectric unit and flexible.

Also, the tabular metal net conductor may have what, is called a two-dimensional meshed structure formed by etching flat metal plates (fourth embodiment).

The electrode base is composed of a material such as baked silver, baked copper, baked platinum or baked nickel. The electrode base is formed by baking silver paste, copper paste, platinum paste or nickel paste, respectively, and is composed of, say, 97% silver and 3% glass frit.

The electrode base may alternatively be formed by plating, CVD, sputtering or vapor deposition of, for example, gold, silver, copper or nickel.

The conductive adhesive is composed of resin silver, resin copper, resin platinum or resin nickel and contains 80% silver and 20% epoxy resin, for example.

Now, the functions and effects of the invention will be explained.

The external electrodes are each so configured that the tabular metal net conductor, sufficiently flexible in the direction of extension or contraction of the multilayer piezoelectric unit, is bonded partially to the electrode base by the conductive adhesives. Even in the case where the multilayer piezoelectric unit is extended or contracted, therefore, the tabular metal net conductor is not broken by being extended or contracted following the extension or contraction of the multilayer piezoelectric unit. Should the electrode base be cracked by the extension or contraction of the multilayer piezoelectric unit, therefore, the tabular metal net conductor and the conductive adhesive can secure the conduction of the external electrodes on the two sides of the cracking. Thus, the external electrodes are not disconnected.

Also, the tabular metal net conductor, which is adapted to extend or contract following the extension or contraction of the multilayer piezoelectric unit, does not restrict the extension or contraction of the multilayer piezoelectric unit. As a result, the multilayer piezoelectric unit extends or contracts sufficiently.

Further, adjacent ones of the conductive adhesives have a mutually superposed portion along the direction parallel to the piezoelectric plates. Therefore, the breakage of the external electrodes can be prevented more positively.

The conductive adhesives arranged in the manner described above are present over the entire area of the external electrodes along the direction parallel to the piezoelectric plates.

Cracking, if it develops in the electrode base, runs in the direction parallel to the piezoelectric plates.

Should two cracks run in the electrode base, therefore, the conductive adhesive always exists on the electrode base between the two cracks. Further, the conductive adhesive is bonded with the tabular metal net conductor. As a result, the electrode base between the two cracks is not electrically isolated, so that the corresponding piezoelectric plate is always supplied with a voltage.

By forming the conductive adhesives as described above, the disconnection of the external electrodes can be prevented even more positively.

As described above, the present invention provides a multilayer-type piezoelectric actuator in which the multilayer piezoelectric unit is sufficiently extended or contracted and the external electrodes are not disconnected.

According to a second aspect of the invention, there is provided a multilayer-type piezoelectric actuator wherein each tabular metal net conductor is formed of conductive wires and at least some of the conductive wires are arranged preferably along the direction of stacking of the multilayer piezoelectric unit (FIGS. 2, 3, 6 and 7(A)–7(B)).

In this case, the electrical resistance of the tabular metal net conductor can be reduced along the direction of stacking of the multilayer piezoelectric unit. Should a crack develop in the electrode base at the time of extension or contraction of the multilayer piezoelectric unit, therefore, the conduction of the external electrodes can be sufficiently secured on the two sides of the crack.

The conductive adhesives are preferably formed at an angle to the thickness of the piezoelectric plates. In this case, the conductive adhesives can be easily formed in such a manner that adjacent ones thereof have a mutually superposed portion along the direction parallel to the piezoelectric plates.

BRIEF DESCRIPTION OF THE DRAWINGS

FIGS. 5(A), 5(B) are diagrams for explaining a malfunction which may develop in the case where the conductive adhesives have no superposed portion K according to the first embodiment, in which FIG. 5(A) is a side view of a multilayer-type piezoelectric actuator, and FIG. 5(B) a sectional view taken in line V(B)—V(B) in FIG. 5(A).

FIGS. 8(A) to 8(E) are diagrams for explaining various shapes of the tabular metal net conductor according to a fourth embodiment of the invention.

FIGS. 9(A) to 9(E) are diagrams for explaining various shapes and arrangements of the conductive adhesives according to a fifth embodiment of the invention.

FIG. 10 is a perspective view of a multilayer-type piezoelectric actuator according to the prior art.

DESCRIPTION OF THE PREFERRED EMBODIMENTS

First Embodiment

A multilayer-type piezoelectric actuator according an embodiment of the invention will be explained with reference to FIGS. 1 to 5(A)–5(B).

Figure 1:
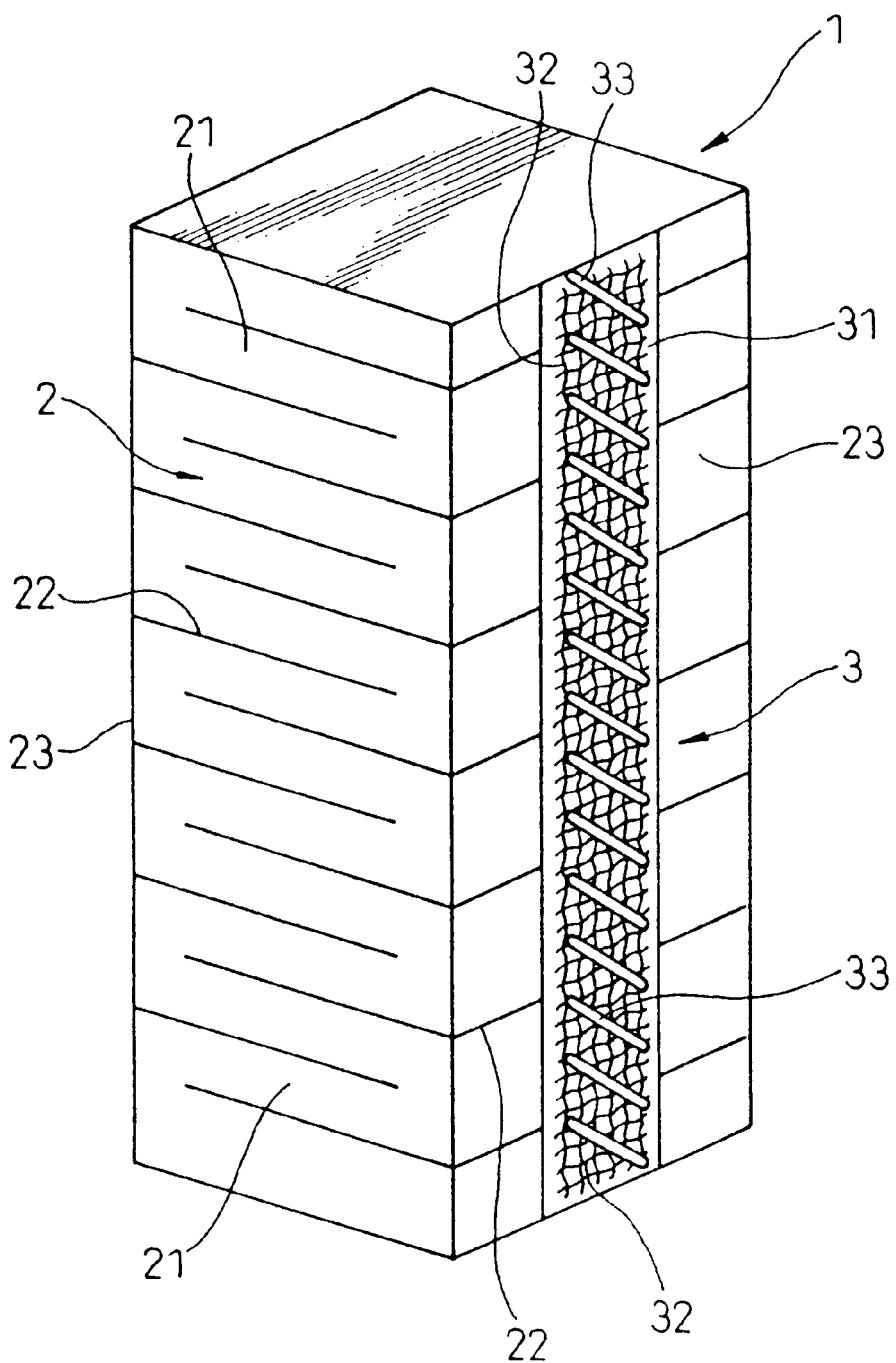
FIG. 1 is a perspective view of a multilayer-type piezoelectric actuator according to a first embodiment of the invention.

A multilayer-type piezoelectric actuator 1 according to this embodiment, as shown in FIG. 1, comprises a multilayer piezoelectric unit 2 including a plurality of piezoelectric plates 21 of a piezoelectric material and a plurality of internal electrodes 22 of a conductive material stacked alternately, and a pair of external electrodes 3 arranged on the side surfaces 23, respectively, of the multilayer piezoelectric unit 2 and electrically connected to the internal electrodes 22.

Figure 2:
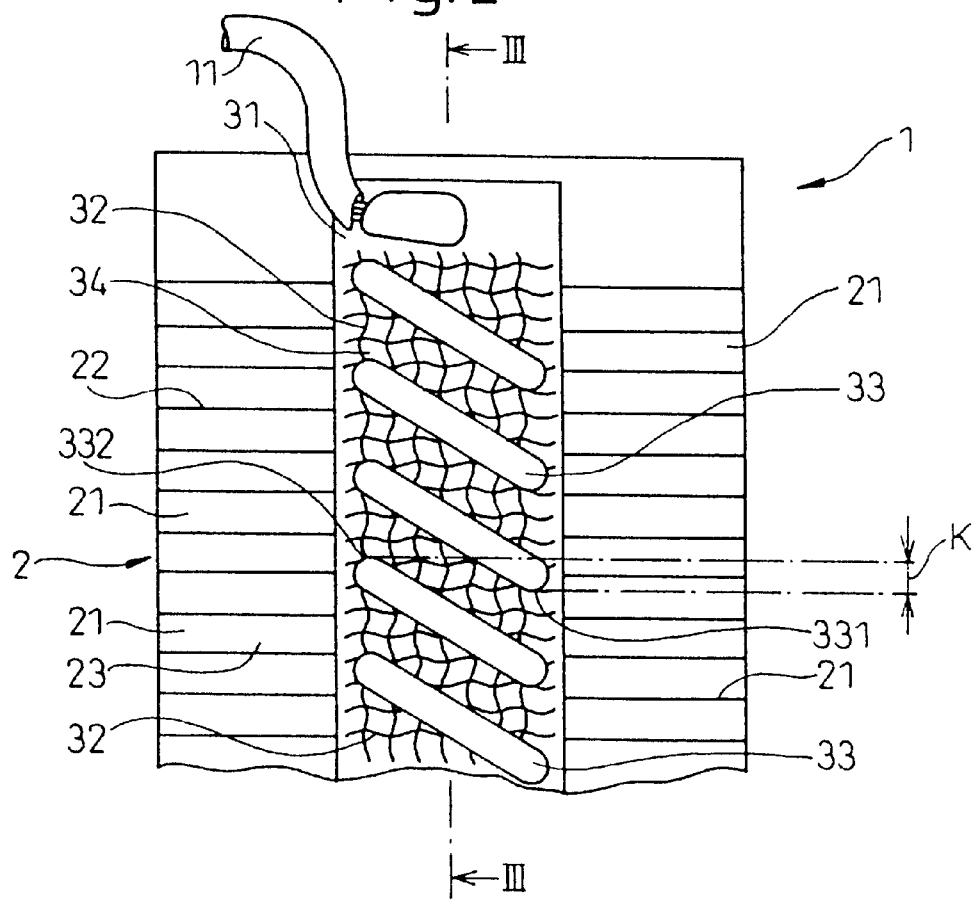
FIG. 2 is a side view of a multilayer-type piezoelectric actuator according to the first embodiment of the invention.
Figure 3:
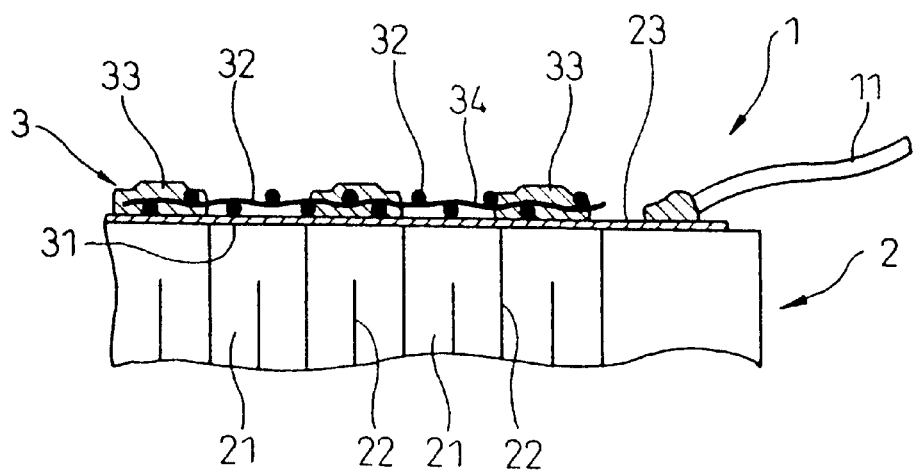
FIG. 3 a sectional view taken in line III—III in FIG. 2.

The external electrodes 3, as shown in FIGS. 1 to 3, each include an electrode base 31 arranged in contact with each side surface 23 of the multilayer piezoelectric unit 2, a tabular metal net conductor 32 arranged on an electrode base 31, and a plurality of conductive adhesives 33 for partially bonding the electrode base 31 and the tabular metal net conductor 32.

The conductive adhesives 33 are formed at an angle to the thickness of the piezoelectric plates 21 as shown in FIG. 2. Adjacent ones of the conductive adhesives 33 have a superposed portion (indicated by reference character K in FIG. 2) in the direction parallel to the piezoelectric plates 21.

Specifically, a plurality of the conductive adhesives 33 inclined at an angle of 30° to the piezoelectric plates 2 are arranged in parallel to each other as a pattern along the direction of stacking of the multilayer piezoelectric unit 2. The lower end portion 331 of the upper one of the adjacent conductive adhesives 33 is located below the upper end portion 332 of the lower conductive adhesive 33.

For simplifying the explanation, one stacking direction of the multilayer piezoelectric unit 2 will be referred to as "upper", and the other stacking direction thereof as "lower".

The tabular metal net conductor 32 is composed of a braid of conductive wires 34 of copper or nickel and has a sufficient flexibility along the direction of extension or contraction of the multilayer piezoelectric unit 2.

The electrode base 31, on the other hand, is formed of baked silver, baked copper, baked platinum, baked nickel, etc., which is produced by baking silver paste, copper paste, platinum paste, etc., respectively.

The conductive adhesives 33 are formed of resin silver, resin copper, resin platinum or resin nickel.

The two external electrodes 3 are arranged on the two opposed side surfaces 23, respectively, of the parallelopipedal multilayer piezoelectric unit 2. As shown in FIG. 1, the internal electrodes 22 are each exposed to only one of the opposed side surfaces 23 and are connected to only the external electrode 3 arranged on the particular side surface 23. The internal electrodes 22 are stacked in such a manner that alternate ones of them are exposed to the same side surface of the multilayer piezoelectric unit 2, and adjacent ones of the internal electrodes 22 are connected to the opposite ones of the external electrodes 3, respectively.

As shown in FIG. 2, an end of each electrode base 31 is connected with one of the lead wires 11. The lead wires 11 are connected to the two external electrodes 3, respectively. By supplying a current from the lead wires 11 to the external electrodes 3, a voltage is applied to the multilayer-type piezoelectric actuator 1.

As a result, the voltage is intermittently supplied to extend or contract the piezoelectric plates 21 and thus extend or contract the multilayer piezoelectric unit 2.

A method of fabricating the external electrodes 3 of the multilayer-type piezoelectric actuator 1 will be explained below.

First, the two opposed side surfaces 23 of the multilayer piezoelectric unit 2 to which the internal electrodes 2 are alternately exposed are each printed with silver paste (GL-18×5), copper paste, platinum paste or nickel paste, dried at 150° C. for ten minutes and baked at 600° C. for ten minutes thereby to form the electrode base 31.

The tabular metal net conductor 32 (of copper or nickel with a wire diameter of 120 μm (#80) and a width of 2.5 mm) is arranged on each of the electrode bases 31. The longitudinal ends of the tabular metal net conductor 32 are temporarily tacked to the stacking ends of the multilayer piezoelectric unit 2, respectively, with an adhesive tape.

The conductive adhesives 33 (CP-5044) are printed in a pattern shown in FIG. 2 on the tabular metal net conductor 32 and dried at 160° C. for ten minutes. As a result, the tabular metal net conductor 32 is partially bonded and electrically connected to each of the electrode bases 31.

Now, the functions and effects of this embodiment will be explained.

Figure 4A:
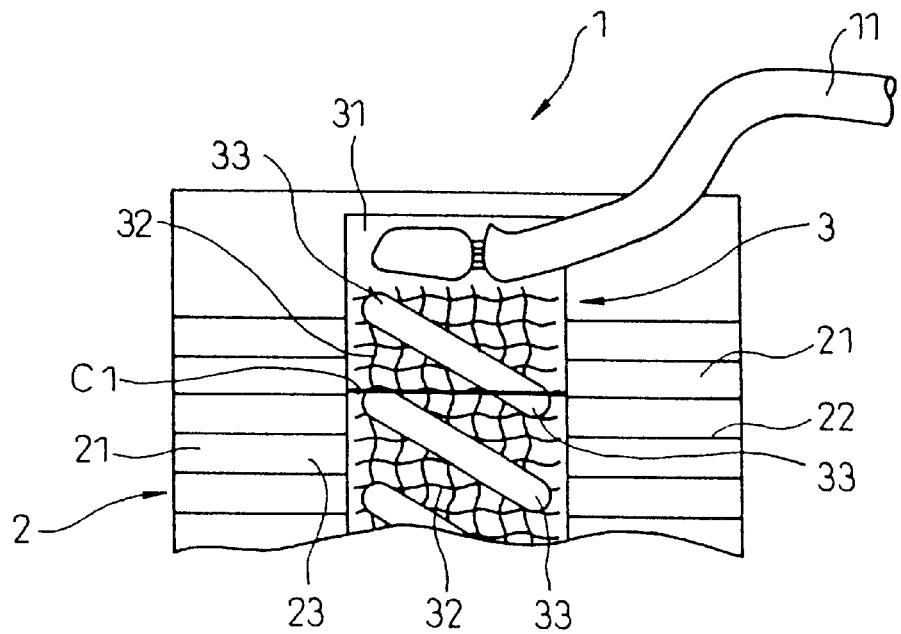
FIG. 4(A) is a diagram for explaining the functions and effects with a crack developed in the electrode base, and FIG. 4(B) a diagram for explaining the functions and effects with two cracks developed in the electrode base, according to the first embodiment.

The external electrodes 3 are each composed of a tabular metal net conductor 32 sufficiently flexible along the direction of extension or contraction of the multilayer piezoelectric unit 2, which tabular metal net conductor 32 is bonded partially to the electrode base 31 with the conductive adhesives 33. As a result, even in the case where the multilayer piezoelectric unit 2 is extended or contracted, the tabular metal net conductor 32 is not broken by extension or contraction. As shown in FIG. 4(A), therefore, even if the electrode base 31 develops a cracking C1 due to the extension or contraction of the multilayer piezoelectric unit 2, the conduction of the external electrodes 3 on the two sides of the crack C1 can be secured by the tabular metal net conductor 32 and the conductive adhesives 33, with the result that the external electrodes 3 are not disconnected.

Also, since the tabular metal net conductor 32 is extended or contracted following the extension or contraction, respectively, of the multilayer piezoelectric unit 2, the extension or contraction of the multilayer piezoelectric unit 2 is not limited. Thus, the multilayer piezoelectric unit 2 is sufficiently extended or contracted. The conductive adhesives 33, as shown in FIG. 2, are formed at an angle to the thickness of the piezoelectric plates 21. Adjacent ones of the conductive adhesives 33 have a mutually superposed portion (designated by character K) along the direction parallel to the piezoelectric plates 21. In this way, as explained below, the disconnection of the external electrodes 3 can be prevented more positively.

Figure 5A:
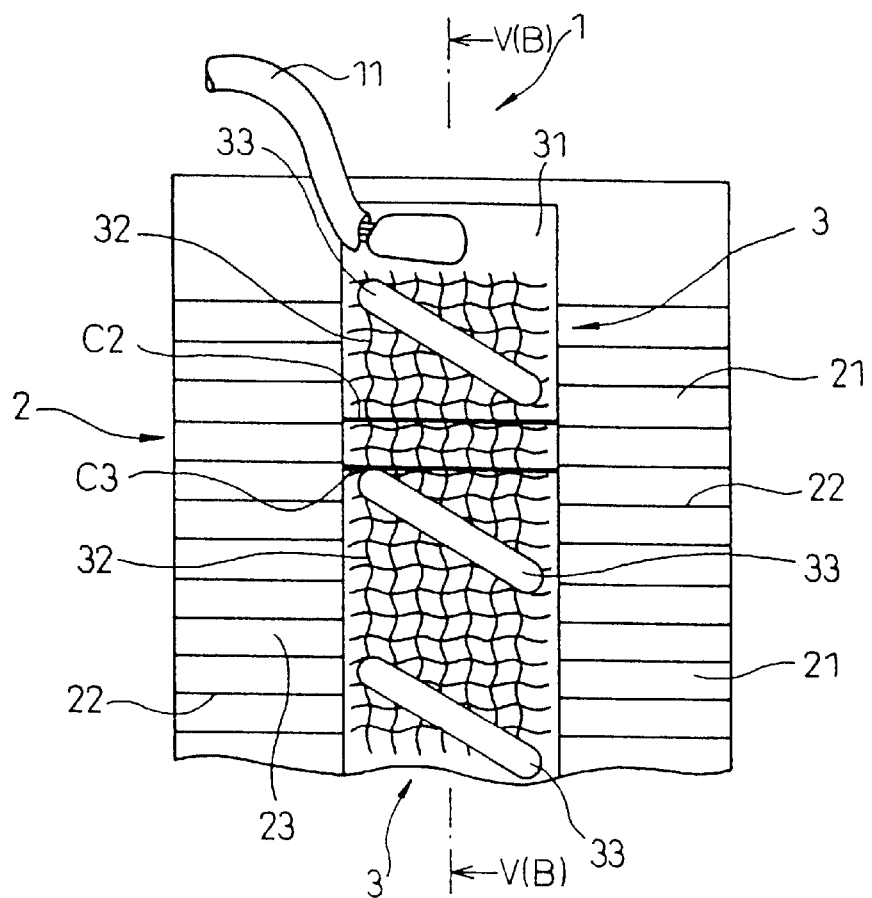
Figure 5B:
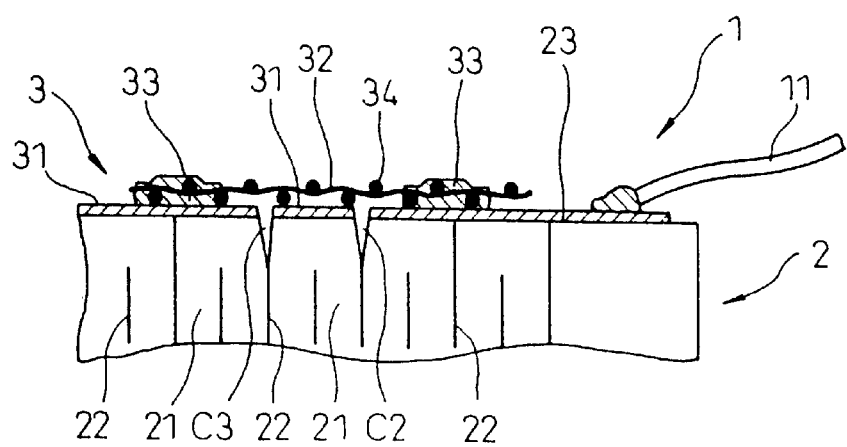

If adjacent ones of the conductive adhesives 33 have no superposed portion in the direction parallel to the piezoelectric plates 21 as shown in FIGS. 5(A) and 5(B), the following inconveniences would result. Specifically, in the case where two cracks C2, C3 develop in the electrode base 31 between adjacent ones of the conductive adhesives 33, the portion of the electrode base 31 between the cracks C2 and C3 would be electrically isolated, and no voltage could be applied to the piezoelectric plates 21 between the cracks C2 and C3.

In the multilayer-type piezoelectric actuator according to this embodiment, in contrast, the conductive adhesives 33 are arranged in the pattern (FIG. 2) described above, and therefore the external electrodes 3 have no part thereof lacking the conductive adhesives 33 in the direction parallel to the piezoelectric plates 31.

Figure 4B:
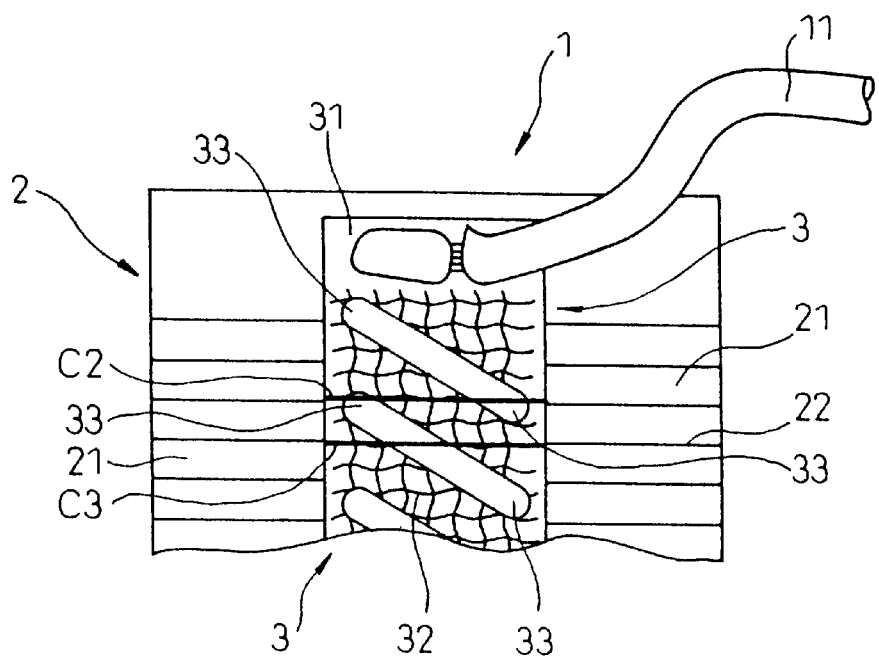

The cracks C1, C2, C3, if any develop in the electrode base 31, are in the direction parallel to the piezoelectric plates 21 (FIGS. 4(A) and 4(B)).

Should two cracks C2, C3 develop in the electrode base 31, as shown in FIG. 4(B), the portion of the electrode base 31 between the two cracks C2, C3 always contacts at least one of the conductive adhesives 33. Further, the conductive adhesives 33 are bonded with the tabular metal net conductor 32. As a result, the portion of the electrode base 31 between the two cracks C2 and C3 is not electrically isolated, and a voltage is applied without fail to the piezoelectric plates 21 in the particular portion.

Thus, the disconnection of the external electrodes 3 can be more positively prevented by forming the conductive adhesives 33 in the manner described above.

As described above, according to this embodiment, a multilayer-type piezoelectric actuator is provided in which the multilayer piezoelectric unit is sufficiently extended or contracted without breaking the external electrodes.

Second Embodiment

Figure 6:
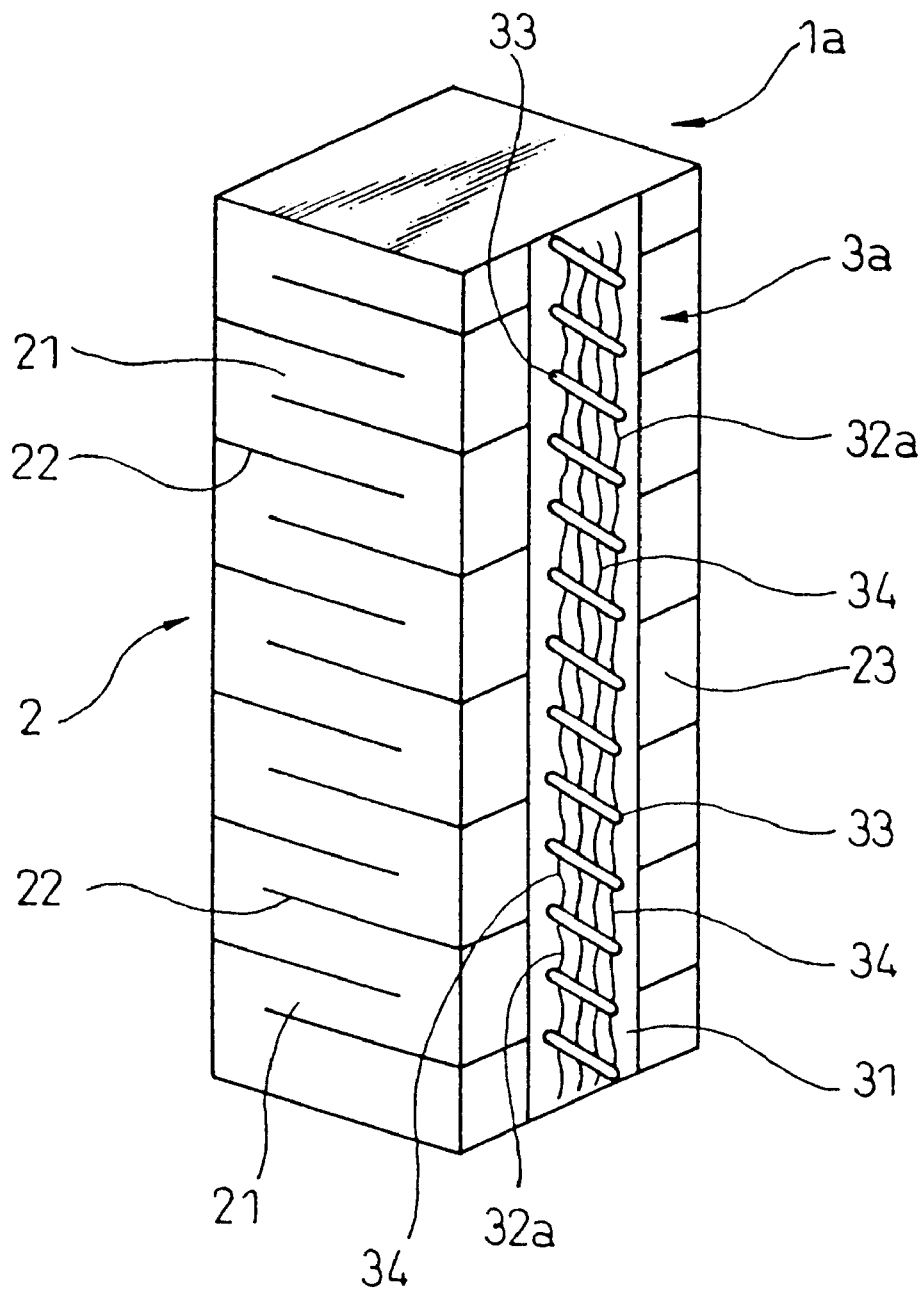
FIG. 6 is a perspective view of a multilayer-type piezoelectric actuator according to a second embodiment of the invention.

According to this embodiment, there is provided a multilayer-type piezoelectric actuator 1a comprising, as shown in FIG. 6, external electrodes 3a each having a tabular metal net conductor 32a having a plurality of curled conductive wires 34 of copper or nickel arranged in parallel.

The conductive wires 34 are arranged along the direction of stacking of the multilayer piezoelectric unit 2.

The other points are similar to those of the first embodiment.

Also in the second embodiment, the tabular metal net conductor 32a formed of the curled conductive wires 34 can sufficiently extend or contract following the extension or contraction of the multilayer piezoelectric unit 2.

In the other respects, the second embodiment has the same functions and effects as the first embodiment.

Third Embodiment

Figure 7A:
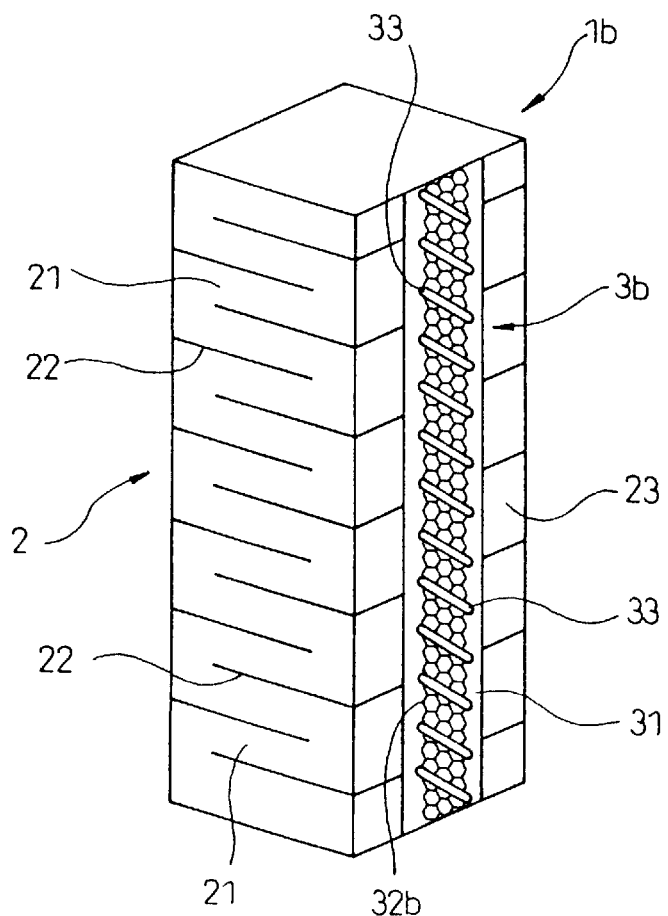
FIG. 7(A) is a perspective view of a multilayer-type piezoelectric actuator.
Figure 7B:
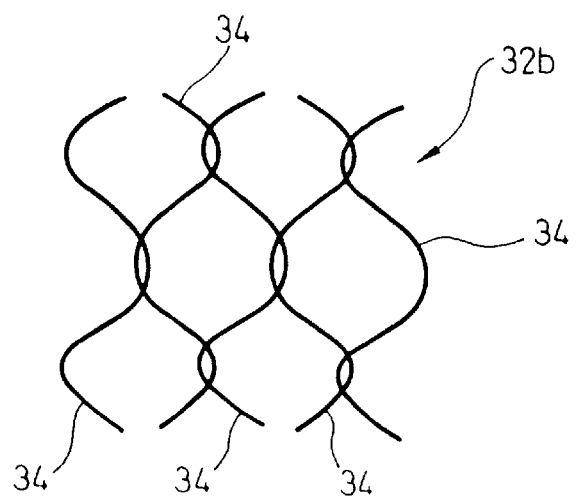
FIG. 7(B), is a diagram for explaining a tabular metal net conductor, according to a third embodiment of the invention.

According to this embodiment, there is provided a multilayer-type piezoelectric actuator 1b comprising external electrodes 3b each including a tabular metal net conductor 32b composed of a wire net, as shown in FIGS. 7(A) and 7(B).

Specifically, as shown in FIG. 7(B), a plurality of corrugated conductive wires 34 of copper or nickel are arranged in the direction of stacking of the multilayer piezoelectric unit 2, and a plurality of similar wires 34 are arranged in the direction perpendicular to the direction of stacking of the multilayer piezoelectric unit 2, in such a manner that adjacent ones of the conductive wires 34 are braided with each other at the valleys and crests held with each other thereby to configure the tabular metal net conductor 32b. The other points are similar to those of the first embodiment.

Also in this case, the tabular metal net conductor 32b sufficiently extends or contracts following the extension or contraction of the multilayer piezoelectric unit 2.

The functions and effects of this embodiment are similar to those of the first embodiment.

Fourth Embodiment

This embodiment represents a case in which as shown in FIGS. 8(A) to 8(E), a flat metal plate is processed into a meshed form thereby to form the tabular metal net conductor 32.

A flat metal plate as thick as 50 to 200 μm, for example, is partially etched thereby to produce the tabular metal net conductor 32 having what is called the two-dimensional meshed structure.

The tabular metal net conductor 32 can have any of the shapes shown in FIGS. 8(A) to 8(E), for example.

Specifically, the tabular metal net conductor 32 shown in FIG. 8(A) has substantially square meshes 321. One of the diagonal lines of each mesh 321 is substantially parallel to the direction of stacking of the multilayer piezoelectric unit.

The tabular metal net conductor 32 shown in FIG. 8(B) has substantially circular meshes 321.

The tabular metal net conductor 32 shown in FIG. 8(C) has substantially rectangular meshes 321, and the long side of each mesh is arranged at an angle to the direction of stacking of the multilayer piezoelectric unit.

The tabular metal net conductor 32 shown in FIG. 8(D) is formed in what is called a honeycombed structure heaving substantially hexagonal meshes 321, The tabular metal net conductor 32 shown in FIG. 81(E) has substantially parallelogrammatic meshes 321. One of the opposite sides of each mesh is formed in the direction perpendicular to the direction of stacking of the multilayer piezoelectric unit, and the other one of the opposite sides is formed at an angle to the direction of stacking of the multilayer piezoelectric unit.

The other points are similar to the corresponding points of the first embodiment.

In this embodiment, the tabular metal net conductor 32 can be easily fabricated. As a result, a multilayer-type piezoelectric actuator inexpensive and easy to fabricate can be produced.

The functions and effects of this embodiment are similar to those of the first embodiment.

Fifth Embodiment

This embodiment represents a case in which, as shown in FIGS. 9(A) to 9(E), the shape and arrangement of the conductive adhesives 33 are variously modified. The various types of the conductive adhesives 33 share the fact that all adjacent ones of them have a portion mutually superposed in the direction parallel to the piezoelectric plates.

The conductive adhesives 33 shown in FIG. 9(A) are arranged in two lines, in a spaced relationship with each other, and at an angle to the direction of stacking of the multilayer piezoelectric unit. The left line and the right line of the conductive adhesives 33 are inclined in opposite directions.

The conductive adhesives 33 shown in FIG. 9(B) are arranged in two lines in spaced relationship with each other in the direction parallel to the direction of stacking of the multilayer piezoelectric unit.

The conductive adhesives 33 shown in FIG. 9(C) are arranged substantially in circles in spaced relationship with each other.

The conductive adhesives 33 shown in FIG. 9(D) are substantially T-shaped and arranged in two opposite transverse directions alternately in spaced relation with each other.

The conductive adhesives 33 shown in FIG. 9(E) are shaped substantially in arcs and arranged in spaced relationship with each other.

As described above, adjacent ones of the conductive adhesives 33 variously shaped and arranged, as in the first embodiment, have a portion mutually superposed in the direction parallel to the piezoelectric plates. As a result, the disconnection of the external electrodes can be positively prevented.

The functions and effects of this embodiment are similar to those of the first embodiment.

The shape and arrangement of the conductive adhesives according to this invention are not limited to those described above.

Sixth Embodiment

This embodiment represents a case in which the electrode bases are each formed by plating, CVD, sputtering or vapor deposition of gold, silver, copper, nickel, etc. The other points are similar to the corresponding points of the first embodiment.

This embodiment also has similar functions and effects to those of the first embodiment.

Seventh Embodiment

This embodiment represents a case in which the durability of the multilayer-type piezoelectric actuator according to the first embodiment of this invention is evaluated.

Specifically, the multilayer-type piezoelectric actuator according to this invention and the multilayer-type piezoelectric actuator according to the prior art described above are both driven, and the number of times they were driven before the external electrodes were disconnected was counted for each of the two actuators.

The number of times driven is defined as the number of times each multilayer-type piezoelectric actuator is extended or contracted.

As the result of this measurement, the external electrodes of the conventional multilayer-type piezoelectric actuator were disconnected when driven about 6×10 times. The external electrodes of the multilayer-type piezoelectric actuator according to this invention, in contrast, were not disconnected even after being driven 2×10 times.

This measurement, according to this embodiment, shows that the external electrodes of the multilayer-type piezoelectric actuator according to this invention are not easily disconnected and have a high durability.

What is claimed is:

1. A multilayer-type piezoelectric actuator comprising:
 a multilayer piezoelectric unit including a plurality of piezoelectric plates of a piezoelectric material and a plurality of internal electrodes of a conductive material arranged in alternate layers; and
 a pair of external electrodes arranged on the side surfaces, respectively, of said multilayer piezoelectric unit and electrically connected to a plurality of said internal electrodes;

wherein said external electrodes each include an electrode base arranged in contact with a corresponding side surface of said multilayer piezoelectric unit, a tabular metal net conductor arranged on said electrode base and a plurality of conductive adhesive regions for partially bonding said electrode base and said tabular metal net conductor; and wherein adjacent ones of said conductive adhesive regions have a portion mutually superposed in the direction parallel to said piezoelectric plates.

2. A multilayer-type piezoelectric actuator according to claim 1, wherein said tabular metal net conductors are each formed of a plurality of conductive wires at least a part of which are arranged along the direction of stacking of said multilayer piezoelectric unit.

3. A multilayer-type piezoelectric actuator according to claim 1, wherein the tabular metal net conductor is formed of a flat metal plate processed into a mesh form.

4. A multilayer-type piezoelectric actuator comprising:

an electrode base of an external electrode, the electrode base in contact with a side surface of a multilayer piezoelectric unit;

a tabular metal net conductor;

a plurality of conductive adhesive regions that partially bond the electrode base to the tabular metal net conductor;

wherein adjacent ones of the conductive adhesive regions have a portion that is mutually superposed in the direction parallel to a stacking direction of the multilayer piezoelectric unit.

5. A multilayer-type piezoelectric actuator according to claim 4, wherein the tabular metal net conductor is formed of a plurality of conductive wires at least a part of which are arranged along a stacking direction of the multilayer piezoelectric unit.

6. A multilayer-type piezoelectric actuator according to claim 4, wherein the tabular metal net conductor is formed of a flat metal plate processed into a mesh form.

7. A method for fabricating a multilayer-type piezoelectric actuator comprising the steps of:

forming an electrode base of an external electrode in contact with a side surface of multilayer piezoelectric unit;

forming a plurality of conductive adhesive regions on a tabular metal net conductor to partially bond the tabular metal net conductor to the electrode base;

wherein adjacent ones of the conductive adhesive regions have a portion that is mutually superposed in the direction parallel to a stacking direction of the multilayer piezoelectric unit.

8. A method for fabricating a multilayer-type piezoelectric actuator according to claim 7, wherein the tabular metal net conductor is formed of a plurality of conductive wires at least a part of which are arranged along a stacking direction of the multilayer piezoelectric unit.

9. A method for fabricating a multilayer-type piezoelectric actuator according to claim 7, wherein the tabular metal net conductor is formed of a flat metal plate processed into a mesh form.

* * * * *